United States Patent
Meng et al.

(10) Patent No.: US 7,791,068 B2
(45) Date of Patent: *Sep. 7, 2010

(54) VERTICAL ORGANIC LIGHT EMITTING TRANSISTOR ASSEMBLY AND HORIZONTAL ORGANIC LIGHT EMITTING TRANSISTOR ASSEMBLY

(75) Inventors: Hsin-Fei Meng, Hsinchu (TW); Sheng-Fu Horng, Hsinchu (TW); Yu-Chiang Chao, Bade (TW)

(73) Assignee: National Chiao Tung University, Hsinchu (TW)

( * ) Notice: Subject to any disclaimer, the term of this patent is extended or adjusted under 35 U.S.C. 154(b) by 49 days.

This patent is subject to a terminal disclaimer.

(21) Appl. No.: 12/153,249

(22) Filed: May 15, 2008

(65) Prior Publication Data
US 2009/0230384 A1 Sep. 17, 2009

(30) Foreign Application Priority Data
Mar. 14, 2008 (TW) .............................. 97108979 A

(51) Int. Cl.
*H01L 29/10* (2006.01)
(52) U.S. Cl. .................... 257/40; 257/50; 257/E51.001
(58) Field of Classification Search .................. 257/43, 257/50, E51.001, 40, 676
See application file for complete search history.

(56) References Cited

U.S. PATENT DOCUMENTS

| | | | |
|---|---|---|---|
| 5,563,424 A | 10/1996 | Yang et al. | |
| 5,804,836 A | 9/1998 | Heeger et al. | |
| 5,965,281 A * | 10/1999 | Cao | 428/690 |
| 6,774,052 B2 | 8/2004 | Vögeli et al. | |
| 6,884,093 B2 | 4/2005 | Baldo et al. | |
| 6,967,436 B2 | 11/2005 | Park | |
| 7,002,176 B2 | 2/2006 | Iechi et al. | |
| 7,126,153 B2 | 10/2006 | Iechi et al. | |
| 2003/0213952 A1* | 11/2003 | Iechi et al. | 257/40 |
| 2004/0004215 A1* | 1/2004 | Iechi et al. | 257/40 |
| 2004/0140960 A1* | 7/2004 | Cok | 345/175 |

(Continued)

OTHER PUBLICATIONS

N. Stutzmann et al., "Self-Aligned, Vertical-Channel, Polymer Field-Effect Transistors", Science, vol. 299, Mar. 21, 2003, pp. 1881-1884.

(Continued)

*Primary Examiner*—Wael M Fahmy
*Assistant Examiner*—John C Ingham
(74) *Attorney, Agent, or Firm*—Stites & Harbison PLLC; Juan Carlos A. Marquez, Esq.

(57) ABSTRACT

A vertical organic light emitting transistor assembly and a horizontal organic light emitting transistor assembly are provided. The vertical organic light emitting transistor assembly comprises a first/second vertical transistor and a first/second organic light emitting diode perpendicularly integrated with the first/second vertical transistor, respectively. The horizontal organic light emitting transistor assembly comprises a substrate, a third vertical transistor and a third organic light emitting diode. The third vertical transistor and the third organic light emitting diode are arranged abreast on the substrate. By integrating the organic light emitting diode and the vertical transistor into a unitary electronic element, the vertical transistor can efficiently drive the organic light emitting diode so that the organic light emitting transistor assembly can overcome limitations caused by existing manufacturing processes and adapt to extensive applications.

22 Claims, 11 Drawing Sheets

U.S. PATENT DOCUMENTS

2005/0218412 A1* 10/2005 Kido et al. .................. 257/79
2009/0108749 A1* 4/2009 Yokoyama et al. .......... 313/504

OTHER PUBLICATIONS

R. Parashkov et al., "Vertical Channel All-Organic Thin-Film Transistor", Applied Physics Letters, vol. 82, No. 25, Jun. 23, 2003, pp. 4579-4580.

M. S. Meruvia et al., "Organic-Metal-Semiconductor Transistor With High Gain", Applied Physics Letters, vol. 84, No. 20, May 17, 2004, pp. 3978-3980.

W. Shockley, "Transistor Electronics: Imperfections, Unipolar and Analog Transistors", Proceedings of the IRE (1952), pp. 1289-1313.

Y. Yang et al., "A New Architecture For Polymer Transistors", Nature, vol. 372, Nov. 24, 1994, pp. 344-346.

J. McElvain et al., "Fullerene-Based Polymer Grid Triodes", J. Appl. Phys., vol. 81, No. 9, May 1, 1997, pp. 6468-6472.

K. Kudo et al., "Fabrication and Device Characterization Of Organic Light Emitting Transistors", Thin Solid Films (2003), pp. 330-333.

K. Kudo, "Organic Light Emitting Transistors", Current Applied Physics 5 (2005), pp. 337-340.

Y.C. Chao et al., Polymer Space-Charge-Limited Transistor, Applied Physics Letters, vol. 88, 2006, pp. 223510-1 to 223510-3.

Yu-Chiang Chao et al., "Polymer Hot-Carrier Transistor", Applied Physics Letters, vol. 87, 2005, pp. 253508-1 to 253508-3.

* cited by examiner

VERTICAL ORGANIC LIGHT EMITTING TRANSISTOR ASSEMBLY AND HORIZONTAL ORGANIC LIGHT EMITTING TRANSISTOR ASSEMBLY

BACKGROUND OF THE INVENTION

1. Technical Field

The present invention relates to a vertical organic light emitting transistor assembly and a horizontal organic light emitting transistor assembly. More particularly, the present invention relates a vertical organic light emitting transistor assembly and a horizontal organic light emitting transistor assembly wherein vertical transistors and organic light emitting diodes are integrated.

2. Description of Related Art

Flexible electronic elements are electronic elements of the next generation and have manifold advantages such as light weight, compact size, ergonomic design adaption, flexibility and so on. These advantages, especially the flexibility that allows the elements to be freely bent or rolled, permit the flexible electronic elements of more extensive applications, such as flexible logics and memories, flexible sensors, flexible lighting, flexible energy and flexible display devices. In the known flexible electronic elements, the most fundamental one, as generally acknowledged, would be an organic transistor.

According to U.S. Pat. No. 7,126,153, a prior organic transistor is capable of emitting light at high luminescence efficiency, operating at high speed, handling large electric power, and can be manufactured at low cost. The organic transistor includes an organic semiconductor layer as a light emission layer, arranged between a source electrode and a drain electrode. It also has gate electrodes provided at intervals approximately in the central part of the organic semiconductor layer, and approximately parallel to the source electrode and the drain electrode, wherein the gate electrodes are shaped like a comb or a mesh. However, while such prior gate electrode requires quite complex manufacturing processes, it would be a challenge to define gate borders. Consequently, any error in the manufacturing processes or gate border definition can adversely affect the luminescence efficiency of the organic transistors.

Hence, it is necessary to overcome limitations caused by the existing manufacturing processes and simplify the manufacturing processes of organic transistors so as to allow the organic transistors to have both the benefits of the existing organic light emitting diode and the existing organic transistors in the attempt to extensively adapt the organic transistors to flexible display devices, flexible sensors, amplification circuits, driving circuits and so on.

SUMMARY OF THE INVENTION

The present invention provides a vertical organic light emitting transistor assembly and a horizontal organic light emitting transistor assembly. By integrating vertical transistors and organic light emitting diodes as a unitary electronic element, the vertical transistors can directly drive the organic light emitting diodes so as to downsize the organic light emitting transistor assembly. Hence, the applicability of the organic light emitting transistor assembly in various electronic devices can be expanded.

To achieve this end, the present invention proposes a vertical organic light emitting transistor assembly that comprises a first vertical transistor, having a first electrode, a first organic layer stacked on the first electrode, and a second electrode located in the first organic layer; and a first organic light emitting diode, having a second organic layer perpendicularly stacked on the first vertical transistor; and a third electrode stacked on second organic layer.

To achieve this end, the present invention further proposes a vertical organic light emitting transistor assembly that comprises a second vertical transistor, having a fifth electrode, a third organic layer stacked on the fifth electrode, an insulation layer stacked on the third organic layer; and a sixth electrode stacked on the insulation layer; and a second organic light emitting diode, having a fourth organic layer perpendicularly stacked on the second vertical transistor; and a seventh electrode stacked on the fourth organic layer.

To achieve this end, the present invention further proposes a horizontal organic light emitting transistor assembly that comprises a substrate, a third vertical transistor arranged at a first location on the substrate and having a first collector, a first grid/base and a first emitter; and a third organic light emitting diode arranged at a second location on the substrate and having an anode an a cathode, wherein the anode is electrically connected to the first collector through a third conductor.

By implementing the present invention, at least the following progressive effects are achievable:

1. Downsizing the organic light emitting transistor assembly for facilitating its application to various electronic devices, 2. Simplifying the manufacturing processes of the organic light emitting transistor, and 3. Vertical transistors can drive organic light emitting diodes directly.

BRIEF DESCRIPTION OF THE DRAWINGS

The invention as well as a preferred mode of use, further objectives and advantages thereof, will best be understood by reference to the following detailed description of an illustrative embodiment when read in conjunction with the accompanying drawings, wherein.

DETAILED DESCRIPTION OF THE PREFERRED EMBODIMENT

First Preferred Embodiment of Vertical Organic Light Emitting Transistor Assembly FIGS. 1 through 5 illustrate a first, a second, a third, a fourth, and a fifth aspects of a vertical organic light emitting transistor assembly 10 according to the present invention.

Figure 1:
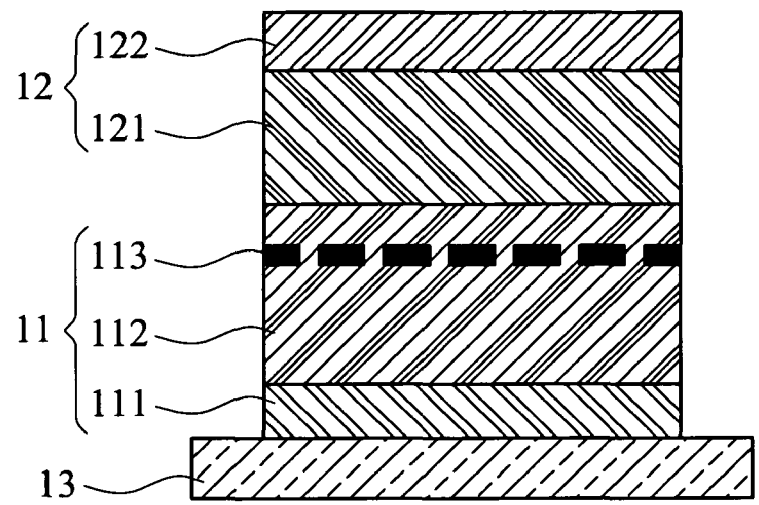
FIG. 1 is a sectional drawing showing a first aspect of a vertical organic light emitting transistor assembly according to the present invention.

As can be seen in FIG. 1, in a first aspect of a vertical organic light emitting transistor according to the present invention, the vertical organic light emitting transistor assembly 10 comprises a first vertical transistor 11 and a first organic light emitting diode 12.

The first vertical transistor 11 has a first electrode 111, a first organic layer 112, and a second electrode 113. The first organic layer 112 is stacked on the first electrode 111, and the second electrode 113 is located in any portion of the first organic layer 112, including being arranged on the first organic layer 112. The second electrode 113 serves to control an amount of electron holes/electrons passing therethrough so as to modulate a luminance of the first organic light emitting diode 12. The first organic layer 112 may be selected from a group consisting of an HIL (Hole Injection Layer), an HTL (Hole Transport Layer), an HBL (Hole Blocking Layer), an EBL (Electron Blocking Layer), an ETL (Electron Transport Layer) and an EIL (Electron Injection Layer).

The first organic light emitting diode 12 has a second organic layer 121 and a third electrode 122. The second organic layer 121 includes an EML (EMission Layer) and may further include at least one of an HIL (Hole Injection Layer), an HTL (Hole Transport Layer), an HBL (Hole Blocking Layer), an EBL (Electron Blocking Layer), an ETL (Electron Transport Layer) and an EIL (Electron Injection Layer) so as to reduce energy barrier difference between the layers and in turn enhance luminescence efficiency of the first organic light emitting diode 12. The second organic layer 121 is perpendicularly stacked on the first vertical transistor 11, for example, on the first organic layer 112 or the second electrode 113, while the third electrode 122 is stacked on the second organic layer 121.

For instance, the first electrode 111 of the first vertical transistor 11 may be an anode made of gold, platinum, aluminum/molybdenum oxide, aluminum/molybdenum oxide/PEDOT, or a combination thereof. Or, the first electrode 111 may be a transparent electrode such as ITO (Indium Tin Oxide). The first organic layer 112 may include an HIL and an HTL, wherein the HIL may be stacked on the first electrode 111, and the HTL may be then stacked on the HIL. The second electrode 113 may be a grid located in any portion of the HTL, including being arranged on the HTL. The third electrode 122 of the first organic light emitting diode 12 may be a cathode, and may be made of calcium/aluminum, lithium fluoride/aluminum, cesium fluoride/aluminum, barium/aluminum or a combination thereof.

The second electrode 113 serves to control an amount of electron holes entering the first organic light emitting diode 12. The electron holes are allowed to pass the second electrode 113 and enter the first organic light emitting diode 12 by properly modulating voltages of the second electrode 113 and the third electrode 122. After entering the first organic light emitting diode 12, the electron holes are recombined with the electrons injected by the third electrode 122 at the second organic layer 121 and thereby the EML of the second organic layer 121 emits light.

In a further example, the first electrode 111 of the first vertical transistor 11 may be a cathode. The first organic layer 112 may include an ETL that may be stacked on the first electrode 111. The second electrode 113 may be a grid located in any portion of the ETL, including being arranged on the ETL. The third electrode 122 may be an anode and may be made of gold, platinum, molybdenum oxide/aluminum, PEDOT/molybdenum oxide/aluminum, or a combination thereof. Alternatively, the third electrode 122 may be a transparent electrode such as ITO (Indium Tin Oxide).

The second electrode 113 serves to control an amount of electrons entering the first organic light emitting diode 12. The electrons are allowed to pass the second electrode 113 and enter the first organic light emitting diode 12 by properly modulating the voltages of the second electrode 113 and the third electrode 122. After entering the first organic light emitting diode 12, the electrons are recombined with the electron holes injected from the third electrode 122 at the second organic layer 121 and thereby the EML of the second organic layer 121 emits light.

Figure 3:
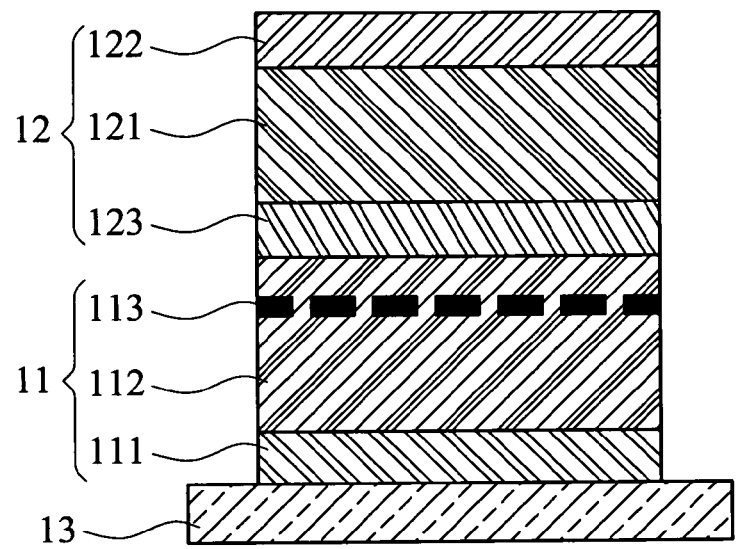
FIG. 3 is a sectional drawing showing a third aspect of the vertical organic light emitting transistor assembly according to the present invention.

As shown in FIGS. 1 and 3, a transparent substrate 13, such as a glass substrate or a plastic substrate, may be provided beside the first vertical transistor 11. In other words, the first electrode 111 of the first vertical transistor 11 may be arranged on the transparent substrate 13, namely the glass substrate or the plastic substrate or so on.

When the first electrode 111 is an anode and the third electrode 122 is a cathode materialized by a very thin metal electrode, the light emitted from the EML of the second organic layer 121 can be emitted upward through the third electrode 122. Besides, when the first electrode 111 is the transparent electrode, the light can also pass the first electrode 111 and be emitted downward through the transparent substrate 13. Similarly, when the first electrode 111 is a cathode and the third electrode 122 is an anode, appropriate materials may be adopted to enable the vertical organic light emitting transistor assembly 10 to emit light in both up and down directions.

Figure 2:
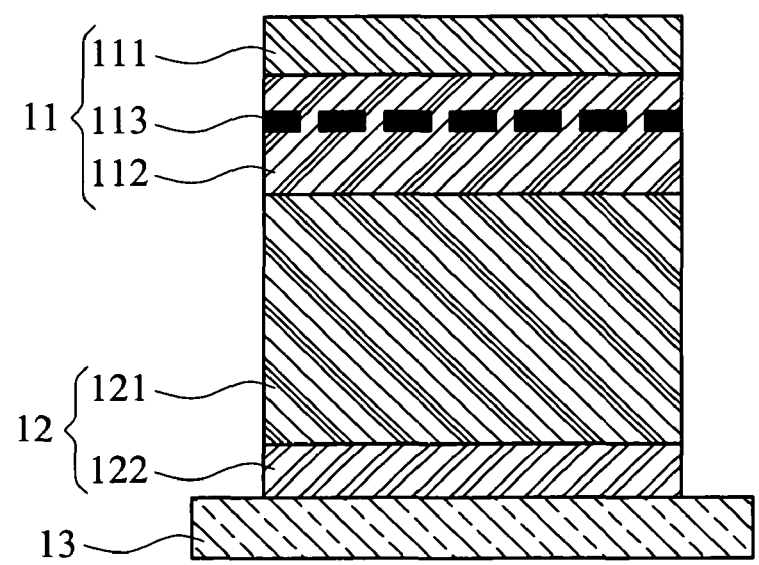
FIG. 2 is a sectional drawing showing a second aspect of the vertical organic light emitting transistor assembly according to the present invention.
Figure 4:
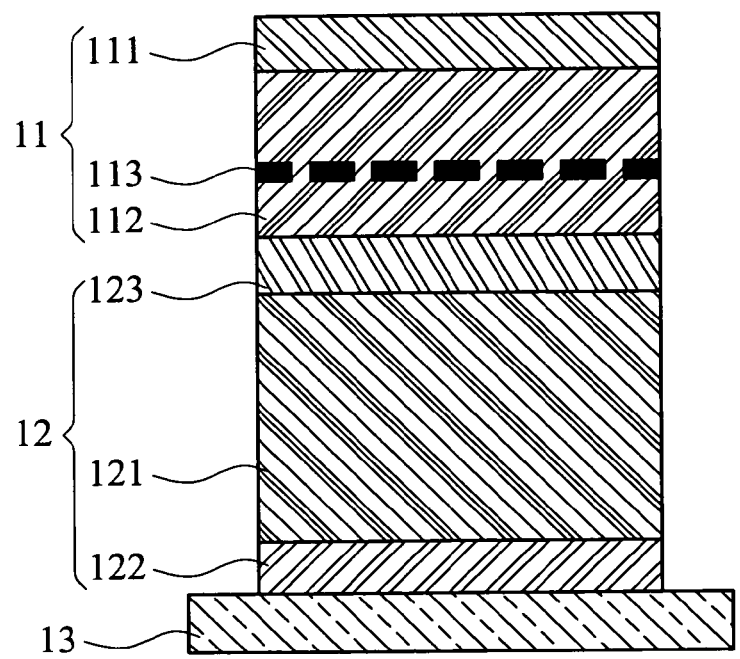
FIG. 4 is a sectional drawing showing a fourth aspect of the vertical organic light emitting transistor assembly according to the present invention.

Alternatively, as shown in FIGS. 2 and 4, the transparent substrate 13, such as a glass substrate or a plastic substrate, may be provided beside the first organic light emitting diode 12. In other words, the third electrode 122 of the first organic light emitting diode 12 may be arranged on the transparent substrate 13, namely the glass substrate or the plastic substrate or so on. When the third electrode 122 is the transparent electrode, the light emitted from the EML of the second organic layer 121 can be also emitted downward through the transparent substrate 13, namely the glass substrate or the plastic substrate. The transparent substrate 13 may be made of a flexible material so that the vertical organic light emitting transistor assembly 10 can be applied to flexible electronic devices.

FIGS. 3 and 4 provide the third and the fourth aspects of the vertical organic light emitting transistor assembly 10. Therein, the vertical organic light emitting transistor assembly 10 may further comprise a fourth electrode 123 arranged between the first organic layer 112 of the first vertical transistor 11 and the second organic layer 121 of the first organic light emitting diode 12. The fourth electrode 123 may be made of a metal, such as aluminum or silver. Or, the fourth electrode 123 may be formed as a multi-layer structure comprising a highly conductive macromolecular material such as PEDOT or metal and other materials. Such multi-layer structure may be made of aluminum/molybdenum oxide, aluminum/molybdenum oxide/PEDOT, gold/PEDOT and so on.

For example, when the first electrode 111 of the first vertical transistor 11 is an anode while the second electrode 113 is a grid, and the third electrode 122 of the first organic light emitting diode 12 is a cathode, the fourth electrode 123 is properly an anode. Otherwise, when the first electrode 111 of the first vertical transistor 11 is a cathode and the second electrode 113 is a grid wile the third electrode 122 of the first organic light emitting diode 12 is an anode, the fourth electrode 123 is properly a cathode.

Figure 5:
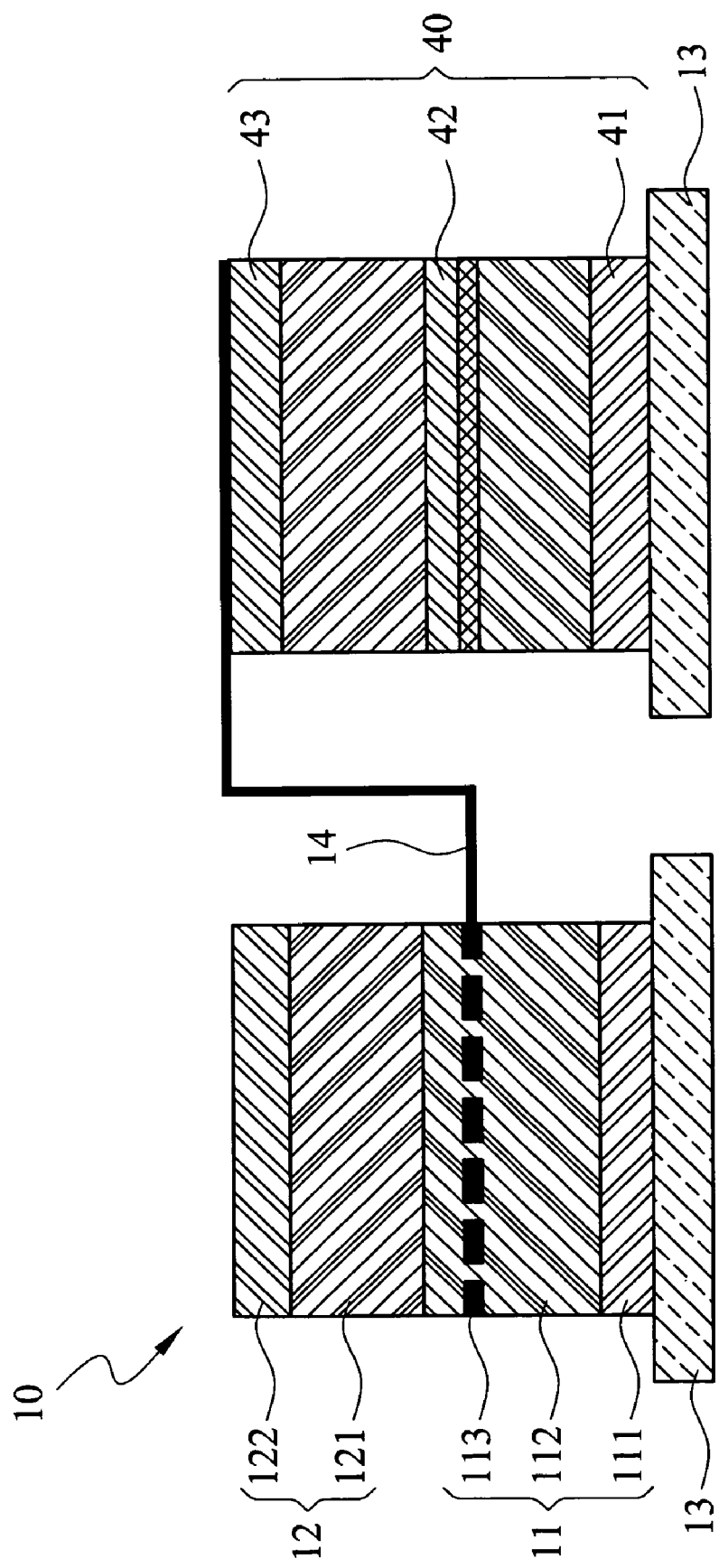
FIG. 5 is a sectional drawing showing a fifth aspect of the vertical organic light emitting transistor assembly according to the present invention.

As shown in FIG. 5, any of the above aspects of the vertical organic light emitting transistor assembly 10 may be further comprise a hot-carrier transistor 40, which has an emitter 41, a base 42 and a collector 43. Such hot-carrier transistor 40 may be realized by a polymer hot-carrier transistor disclosed in Journal of Applied Physics, Vol. 87, p. 253508 published in 2005.

The collector 43 of the hot-carrier transistor 40 may be electrically connected to the second electrode 113 of the first vertical transistor 11 through a first conductor 14. Thus, the current applied on the base 42 can modulate the output current of the collector 43 of the hot-carrier transistor 40 and in turn modulate the second electrode 113 of the vertical organic light emitting transistor assembly 10 with respect to its voltage so as to achieve current amplification. In addition, the luminance of the vertical organic light emitting transistor assembly 10 can be controlled by modulating the current on the base 42 of the hot-carrier transistor 40.

Second Preferred Embodiment of Vertical Organic Light Emitting Transistor Assembly FIGS. 6 through 10 illustrate a sixth, a seventh, an eighth, a ninth, and a tenth aspects of a vertical organic light emitting transistor assembly 20 according to the present invention.

Figure 6:
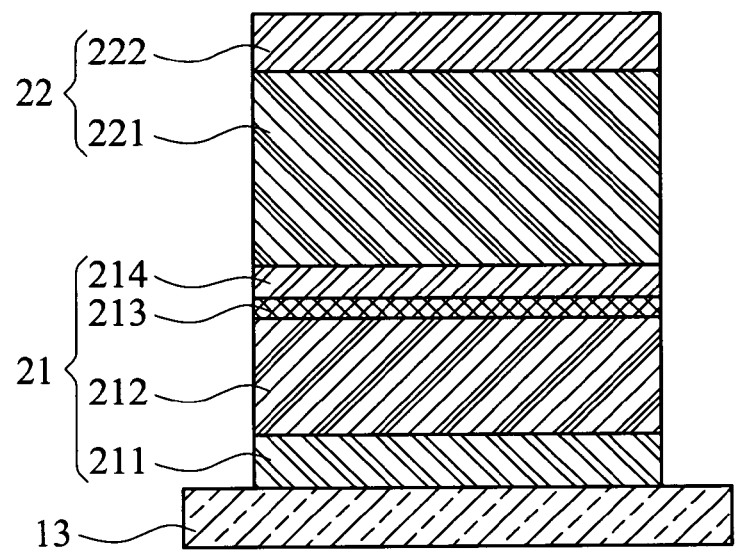
FIG. 6 is a sectional drawing showing a sixth aspect of the vertical organic light emitting transistor assembly according to the present invention.

As shown in FIG. 6, according to the sixth aspect of the vertical organic light emitting transistor assembly 20, the vertical organic light emitting transistor assembly 20 comprises a second vertical transistor 21 and a second organic light emitting diode 22.

The second vertical transistor 21 has a fifth electrode 211, a third organic layer 212, an insulation layer 213 and a sixth electrode 214. The third organic layer 212 is stacked on the fifth electrode 211, and the insulation layer 213 is stacked between the third organic layer 212 and the sixth electrode 214. The third organic layer 212 may be selected from a group consisting of an HIL (Hole Injection Layer), an HTL (Hole Transport Layer), an HBL (Hole Blocking Layer), an EBL (Electron Blocking Layer), an ETL (Electron Transport Layer) and an EIL (Electron Injection Layer).

The second organic light emitting diode 22 has a fourth organic layer 221, and a seventh electrode 222. The fourth organic layer 221 includes an EML (EMission Layer) and may further include at least one of an HIL, an HTL, an HBL, an EBL, an ETL and an EIL so as to reduce energy barrier difference between the layers and in turn enhance luminescence efficiency of the second organic light emitting diode 22. The fourth organic layer 221 is perpendicularly stacked on the second vertical transistor 21, for example, on the sixth electrode 214, while the seventh electrode 222 is stacked on the fourth organic layer 221.

For instance, the fifth electrode 211 of the second vertical transistor 21 may be an anode, and may be made of gold, platinum, aluminum/molybdenum oxide, aluminum/molybdenum oxide/PEDOT, or a combination thereof or may be a transparent electrode such as ITO (Indium Tin Oxide). The third organic layer 212 may include an HIL and an HTL, wherein the HIL may be stacked on the fifth electrode 211, and the HTL may be then stacked on the HIL. The insulation layer 213 may be firstly stacked on the HTL and the sixth electrode 214 may be then stacked on the insulation layer 213. The sixth electrode 214 may be a base. The fourth organic layer 221 of the second organic light emitting diode 22 may include an EML. The seventh electrode 222 may be a cathode made of calcium/aluminum, lithium fluoride/aluminum, cesium fluoride/aluminum, barium/aluminum or a combination thereof.

When the insulation layer 213 and the sixth electrode 214 are in proper thicknesses, the electron holes injected from the fifth electrode 211 are allowed to tunnel through the insulation layer 213 and then pass through the sixth electrode 214 ballistically. By controlling the current of the sixth electrode 214, the electron holes can pass the sixth electrode 214 and get into the fourth organic layer 221 without collision and contribute to the base current.

After passing through the sixth electrode 214 and reaching the fourth organic layer 221, the electron holes are recombined with the electrons injected from the seventh electrode 222 at the fourth organic layer 221 and thereby the EML of the fourth organic layer 221 emits light. Consequently, a light-emitting intensity of the second organic light emitting diode 22 can be controlled by using a current of the sixth electrode 214 to modulate the amount the electron holes entering the second organic light emitting diode 22.

In a further example, the fifth electrode 211 of the second vertical transistor 21 may be a cathode. The third organic layer 212 may include an ETL that may be stacked on the fifth electrode 211. The insulation layer 213 may be firstly stacked on the ETL and the sixth electrode 214 may be then stacked on the insulation layer 213. The sixth electrode 214 may be a base. The fourth organic layer 221 of the second organic light emitting diode 22 may include an EML. The seventh electrode 222 may be an anode made of gold, platinum, molybdenum oxide/aluminum, PEDOT/molybdenum oxide/aluminum, or a combination thereof. Alternatively, the seventh electrode 222 may be a transparent electrode such as ITO (Indium Tin Oxide).

Similarly, when the insulation layer 213 and the sixth electrode 214 are in proper thicknesses, the electrons injected from the fifth electrode 211 are allowed to tunnel through the insulation layer 213 and then pass through the sixth electrode 214 ballistically. By controlling the current of the sixth electrode 214, the electron can pass the sixth electrode 214 and get into the fourth organic layer 221 without collision and contribute to the base current. After passing through the sixth electrode 214 and reaching the fourth organic layer 221, the electrons are recombined with the electron holes injected from the seventh electrode 222 at the fourth organic layer 221 and thereby the EML of the fourth organic layer 221 emits light. Consequently, a light-emitting intensity of the second organic light emitting diode 22 can be controlled by using the current of the sixth electrode 214 to modulate the amount the electrons entering the second organic light emitting diode 22.

Figure 8:
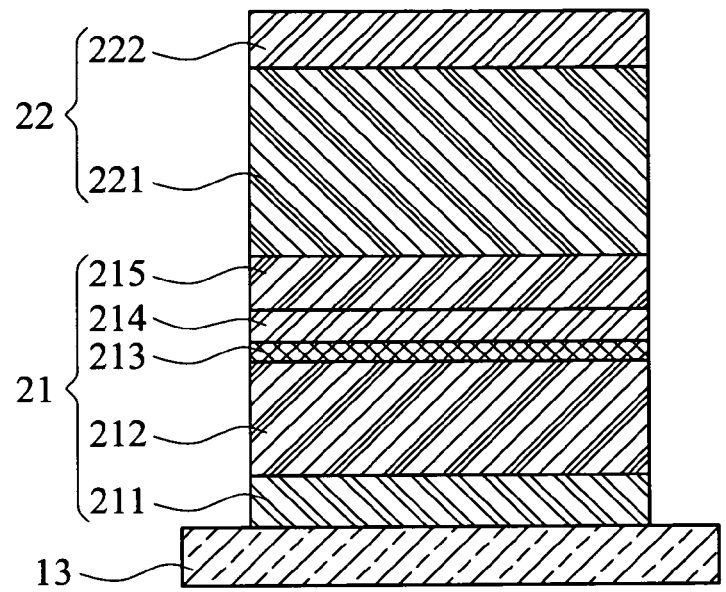
FIG. 8 is a sectional drawing showing an eighth aspect of the vertical organic light emitting transistor assembly according to the present invention.
Figure 9:
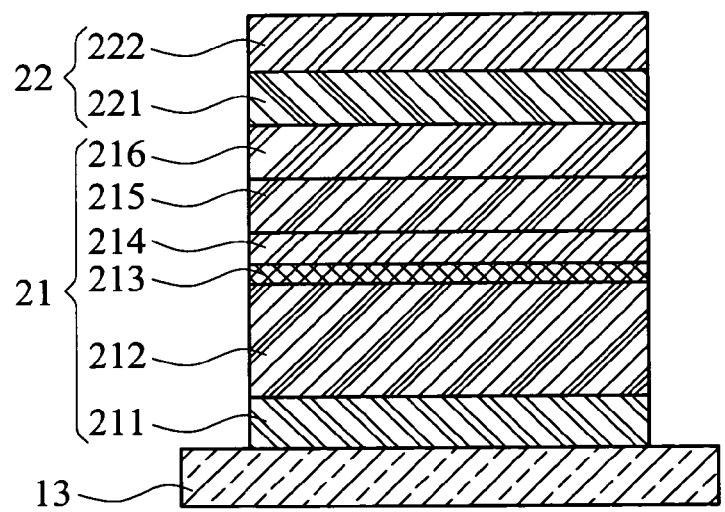
FIG. 9 is a sectional drawing showing a ninth aspect of the vertical organic light emitting transistor assembly according to the present invention.

As shown in FIGS. 6, 8 and 9, a transparent substrate 13, such as a glass substrate or a plastic substrate, may be provided beside the second vertical transistor 21. In other words, the fifth electrode 211 of the second vertical transistor 21 may be arranged on the transparent substrate 13, namely the glass substrate or the plastic substrate or so on.

When the fifth electrode 211 is an anode and the seventh electrode 222 is a cathode materialized by a very thin metal electrode, the light emitted from the EML of the fourth organic layer 221 can be emitted upward through the seventh electrode 222. Besides, when the fifth electrode 211 is the transparent electrode, the light can also pass the fifth electrode 211 and be emitted downward through the transparent substrate 13. Similarly, when the fifth electrode 211 is a cathode and the seventh electrode 222 is an anode, appropriate materials may be adopted to enable the vertical organic light emitting transistor assembly 20 to emit light in both up and down directions.

Figure 7:
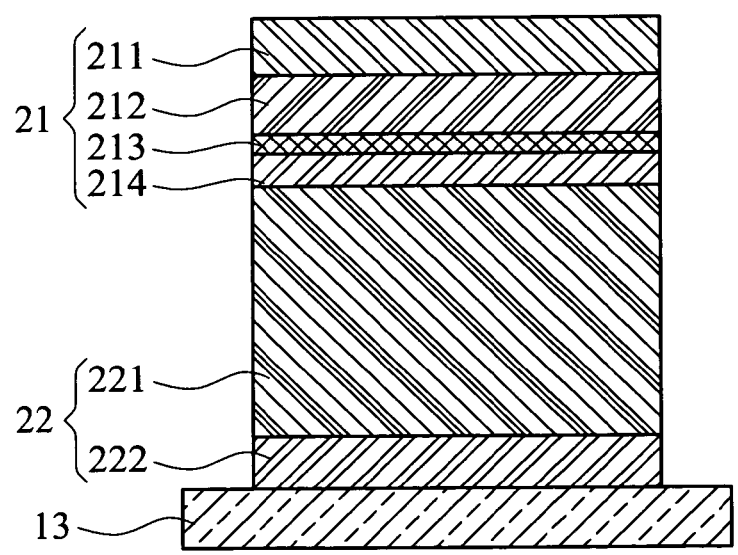
FIG. 7 is a sectional drawing showing a seventh aspect of the vertical organic light emitting transistor assembly according to the present invention.

Alternatively, as shown in FIG. 7, the transparent substrate 13, such as a glass substrate or a plastic substrate, may be provided beside the second organic light emitting diode 22. In other words, the seventh electrode 222 of the second organic light emitting diode 22 may be arranged on the transparent substrate 13, namely the glass substrate or the plastic substrate or so on. When the seventh electrode 222 is the transparent electrode, the light emitted from the EML of the fourth organic layer 221 can be also emitted downward through the transparent substrate 13, namely the glass substrate or the plastic substrate. The transparent substrate 13 may be made of a flexible material so that the vertical organic light emitting transistor assembly 20 can be applied to flexible electronic devices.

FIG. 8 provides the eighth aspect of the vertical organic light emitting transistor assembly 20. Therein, the second vertical transistor 21 may further comprise a fifth organic layer 215, which may be an ETL, an EBL, an HTL, or an HBL. Besides, the fifth organic layer 215 may be arranged between the sixth electrode 214 of the second vertical transistor 21 and the fourth organic layer 221 of the second organic light emitting diode 22.

Though, according to FIG. 8, a transparent substrate 13, such as a glass substrate or a plastic substrate, may be provided beside the second vertical transistor 21, in another aspect, the transparent substrate 13, such as a glass substrate or a plastic substrate, may be provided beside the second organic light emitting diode 22 (not shown) so that the seventh electrode 222 of the second organic light emitting diode 22 is arranged on the transparent substrate 13, namely the glass substrate or the plastic substrate or so on. In addition, the seventh electrode 222 may be materialized as a transparent electrode. Thus, the light emitted from the EML of the fourth organic layer 221 can pass downward through the seventh electrode 222 and the transparent substrate 13 successively, namely the glass substrate or the plastic substrate and be emitted downward.

In FIG. 9, according to the ninth aspect of the vertical organic light emitting transistor assembly 20, a fifth organic layer 215 and an eighth electrode 216 are further contained therein.

The fifth organic layer 215 may be an ETL or an HTL, which is stacked on the sixth electrode 214. The eighth electrode 216 is further stacked on the fifth organic layer 215 so that the fifth organic layer 215 is sandwiched between the sixth electrode 214 and the eighth electrode 216 while the fourth organic layer 221 is further stacked on the eighth electrode 216. The eighth electrode 216 may be made of a metal, such as aluminum or silver or so on. Or, the eighth electrode 216 may be formed as a multi-layer structure comprising a highly conductive macromolecular material such as PEDOT or metal and other materials. Such multi-layer structure may be made of aluminum/molybdenum oxide, aluminum/molybdenum oxide/PEDOT, gold/PEDOT and so on.

For example, when the fifth electrode 211 of the second vertical transistor 21 is an anode and the sixth electrode 214 is a base while the seventh electrode 222 is a cathode, the eighth electrode 216 is properly an anode. Otherwise, when the fifth electrode 211 of the second vertical transistor 21 is a cathode and the sixth electrode 214 is a base while the seventh electrode 222 is an anode, the eighth electrode 216 is properly a cathode.

In FIG. 9, according to the ninth aspect of the vertical organic light emitting transistor assembly 20, a transparent substrate 13, such as a glass substrate or a plastic substrate, may be provided beside the second vertical transistor 21. However, in another aspect, the transparent substrate 13, such as a glass substrate or a plastic substrate, may be provided beside the second organic light emitting diode 22 (not shown). In addition, the seventh electrode 222 may be materialized as a very thin transparent electrode. Thus, the light emitted from the EML of the fourth organic layer 221 can pass downward through the seventh electrode 222 and the transparent substrate 13 successively, namely the glass substrate or the plastic substrate and be emitted downward.

Figure 10:
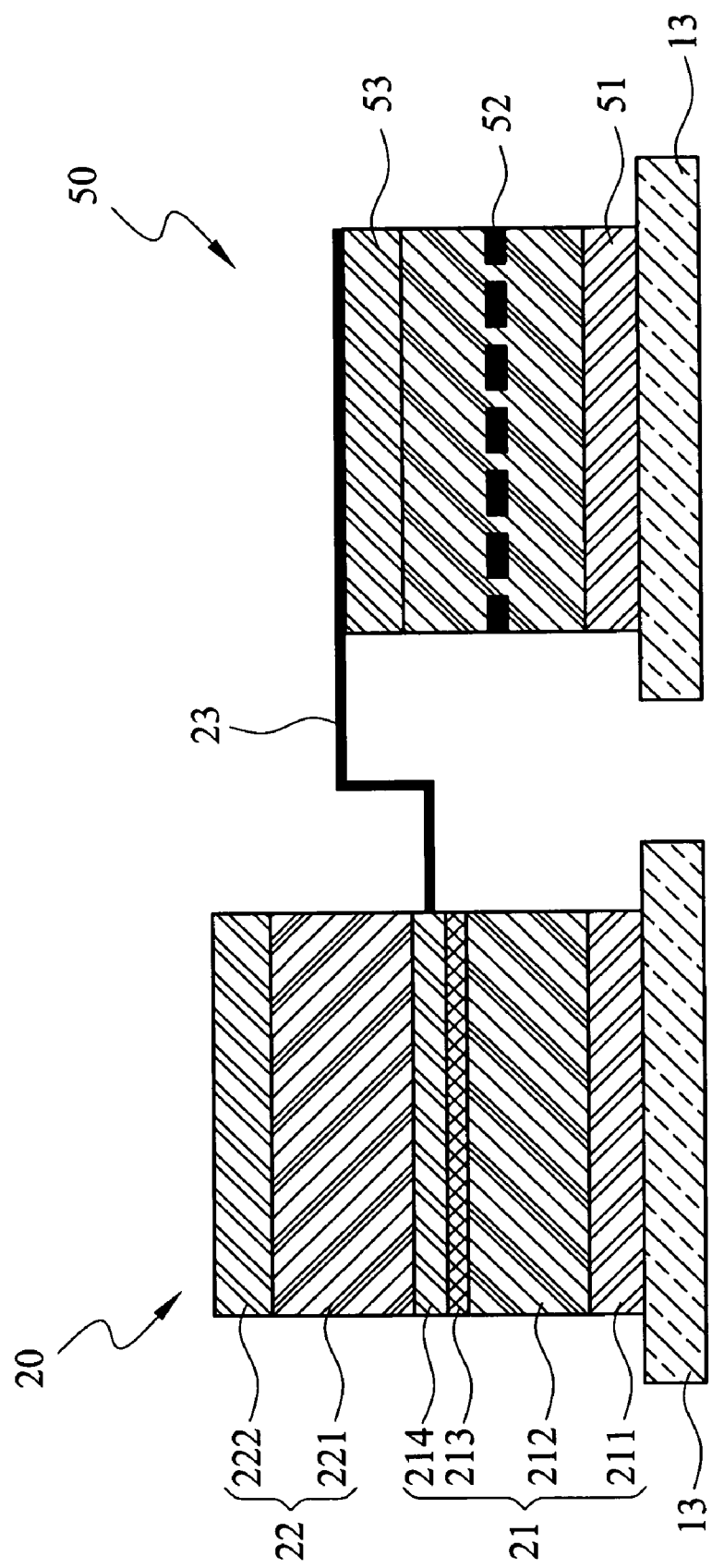
FIG. 10 is a sectional drawing showing a tenth aspect of the vertical organic light emitting transistor assembly according to the present invention.

As shown in FIG. 10, any of the aforementioned aspects of the vertical organic light emitting transistor assembly 20 may be further comprise a space-charge-limited transistor 50, which has an emitter 51, a grid 52 and a collector 53. Such space-charge-limited transistor 50 may be realized by a polymer spaced-charge-limited transistor disclosed in Journal of Applied Physics, Vol. 88, p. 223510 published in 2006.

The collector 53 of the space-charge-limited transistor 50 may be electrically connected to the sixth electrode 214 of the second vertical transistor 21 through a second conductor 23. Thus, the current of the sixth electrode 214 of the second vertical transistor 21 can be controlled by modulating a voltage of the grid 52 of the space-charge-limited transistor 50, and in turn the electrons/electron holes are allowed to pass the sixth electrode 214 and reach the fourth organic layer 221 so as to recombined with the electrons/electron holes injected from the seventh electrode 222 at the fourth organic layer 221 and thereby the EML of the fourth organic layer 221 emits light. Consequently, a light-emitting intensity of the second organic light emitting diode 22 can be controlled by modulating the voltage of the grid 52 of the space-charge-limited transistor 50.

Preferred Embodiment of Horizontal Organic Light Emitting Transistor Assembly

FIGS. 11 through 15 illustrate a first, a second, a third, a fourth, and a fifth aspects of a horizontal organic light emitting transistor assembly 30 according to the present invention.

Figure 11:
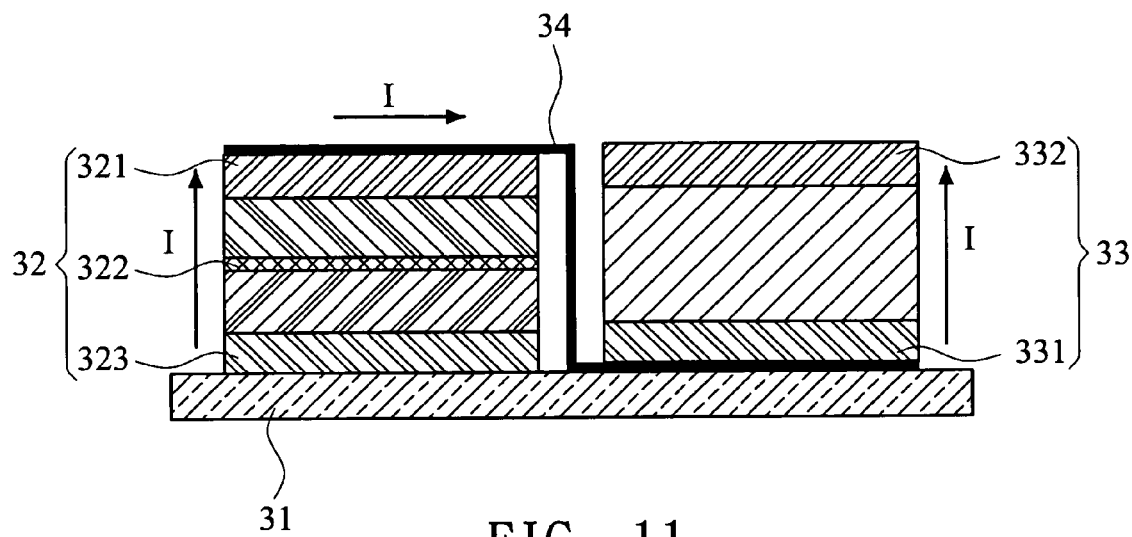
FIG. 11 is a sectional drawing showing a first aspect of a horizontal organic light emitting transistor assembly according to the present invention.

As can be seen in FIG. 11, in the first aspect of the horizontal organic light emitting transistor assembly 30 according to the present invention, the horizontal organic light emitting transistor assembly 30 comprises a substrate 31, a third vertical transistor 32 and a third organic light emitting diode 33.

The substrate 31 may be a transparent substrate, a glass substrate, or a plastic substrate. The substrate 31 may set the third vertical transistor 32 and the third organic light emitting diode 33 arranged abreast thereon. Moreover, the substrate 31 may be made of a flexible material so that the horizontal organic light emitting transistor assembly 30 can be applied to flexible electronic devices.

The third vertical transistor 32 is deposited at a first location on the substrate 31, wherein the first location may be any location on the substrate 31. The third vertical transistor 32 may be a space-charge-limited transistor, which has a first collector 321, a first grid 322 and a first emitter 323. Alternatively, the third vertical transistor 32 may be a hot-carrier transistor, which has a first collector 321, a first base (not shown) and a first emitter 323. The space-charge-limited transistor and the hot-carrier transistor implemented herein are similar to those described previously on the first and second preferred embodiment of the present invention.

The third organic light emitting diode 33 is deposited at a second location on the substrate 31, wherein the second location may border on the first location so that the third organic light emitting diode 33 and the third vertical transistor 32 stand side by side. The third organic light emitting diode 33 has an anode 331 and a cathode 332, wherein the anode 331 is electrically connected to the first collector 321 of the third vertical transistor 32 through a third conductor 34.

Referring to FIG. 11, in the first aspect of the horizontal organic light emitting transistor assembly 30, the third vertical transistor 32 is deposited at the first location on the substrate 31 while the third organic light emitting diode 33 is deposited at the second location. Meanwhile, the first emitter 323 of the third vertical transistor 32 is in close contact with the substrate 31 while the third conductor 34 is positioned between the anode 331 of the third organic light emitting diode 33 and the substrate 31.

Since the third vertical transistor 32 is electrically connected to the third organic light emitting diode 33 through the third conductor 34, after the current output running upward to the first collector 321, the current output from the first emitter 323 can proceed to the anode 331 of the third organic light emitting diode 33 through the third conductor 34 so as to conduct the third organic light emitting diode 33. Consequently, a light-emitting intensity of the third organic light emitting diode 33 can be controlled by the third vertical transistor 32.

Figure 12:
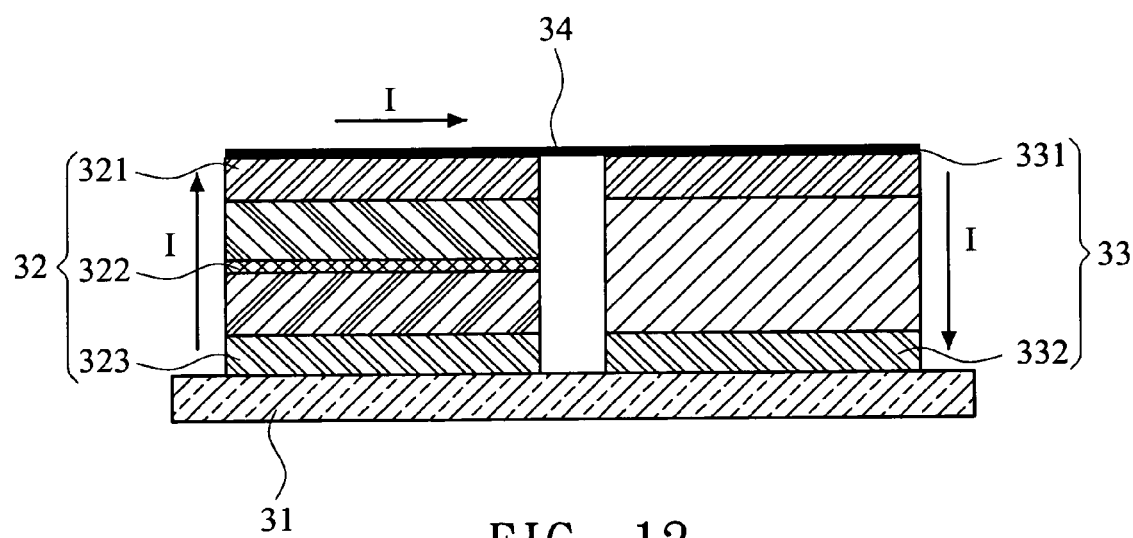
FIG. 12 is a sectional drawing showing a second aspect of the horizontal organic light emitting transistor assembly according to the present invention.

Referring to FIG. 12, in the second aspect of the horizontal organic light emitting transistor assembly 30, the first emitter 323 of the third vertical transistor 32 is in close contact with the substrate 31 while the cathode 332 of the third organic light emitting diode 33 is also in close contact with the substrate 31. Thereby, when the first emitter 323 of the third vertical transistor 32 and the anode 331 of the third organic light emitting diode 33 are electrically connected through the third conductor 34, after running upward to the first collector 321, a current output by the first emitter 323 can proceed to the anode 331 of the third organic light emitting diode 33 through the third conductor 34, thereby conducting the third organic light emitting diode 33 and dominating a light-emitting intensity of the third organic light emitting diode 33.

Figure 13:
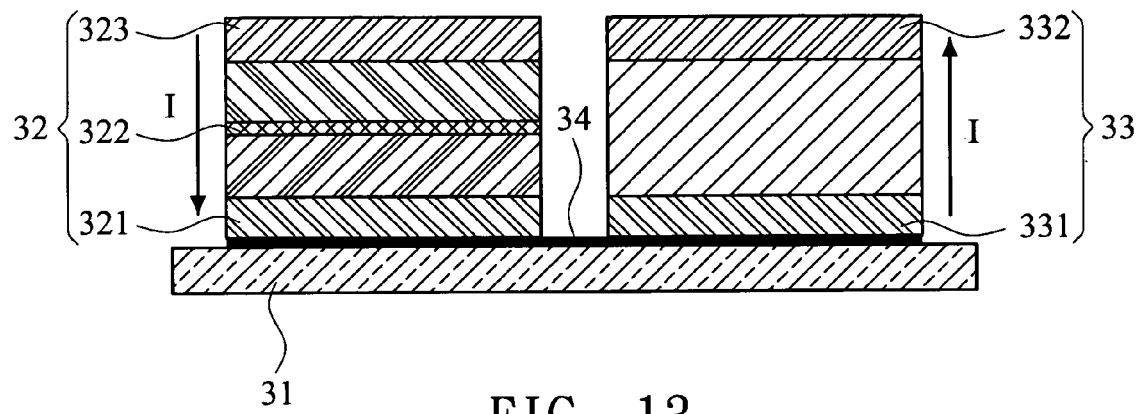
FIG. 13 is a sectional drawing showing a third aspect of the horizontal organic light emitting transistor assembly according to the present invention.

As shown in FIG. 13, the third aspect of the horizontal organic light emitting transistor assembly 30 has the third conductor 34 positioned between the first collector 321 of the third vertical transistor 32 and the substrate 31 and also positioned between the anode 331 of the third organic light emitting diode 33 and the substrate 31. Thereby, a current output by the first emitter 323 of the third vertical transistor 32 can run downward to the first collector 321, and then proceed to the anode 331 of the third organic light emitting diode 33 through the third conductor 34, thereby conducting the third organic light emitting diode 33 and dominating a light-emitting intensity of the third organic light emitting diode 33.

Figure 14:
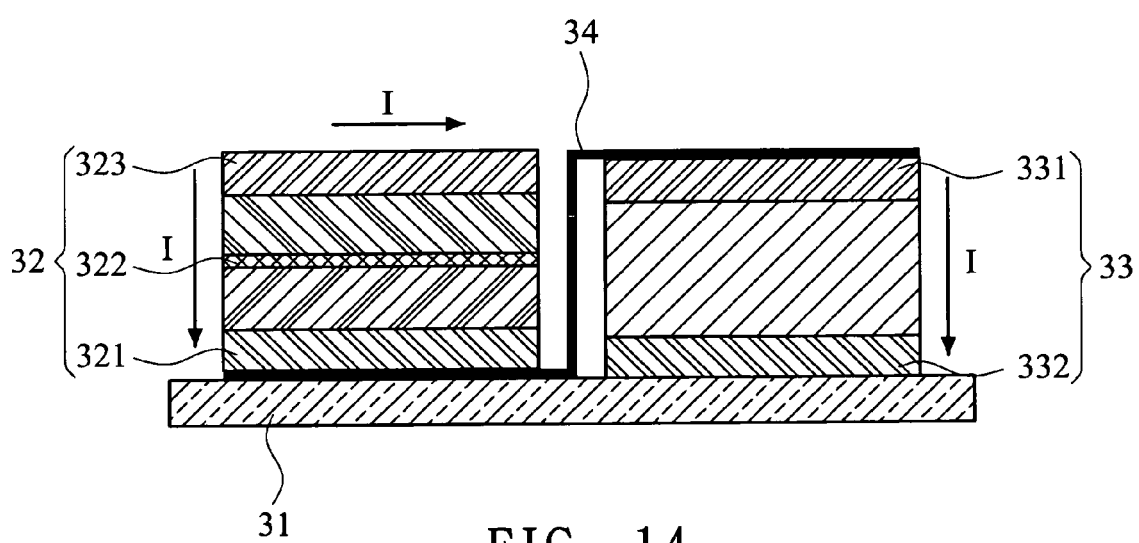
FIG. 14 is a sectional drawing showing a fourth aspect of the horizontal organic light emitting transistor assembly according to the present invention.

In the fourth aspect of the horizontal organic light emitting transistor assembly 30 as shown in FIG. 14, the third conductor 34 is positioned between the first collector 321 of the third vertical transistor 32 and the substrate 31 while electrically connecting the anode 331 of the third organic light emitting diode 33, wherein the cathode 332 of the third organic light emitting diode 33 is in close contact with the substrate 31. Thereby, when a current output by the first emitter 323 runs downward to the first collector 321, the third conductor 34 can pass the same to the anode 331 of the third organic light emitting diode 33 so that the third vertical transistor 32 can control a light-emitting intensity of the third organic light emitting diode 33.

Figure 15:
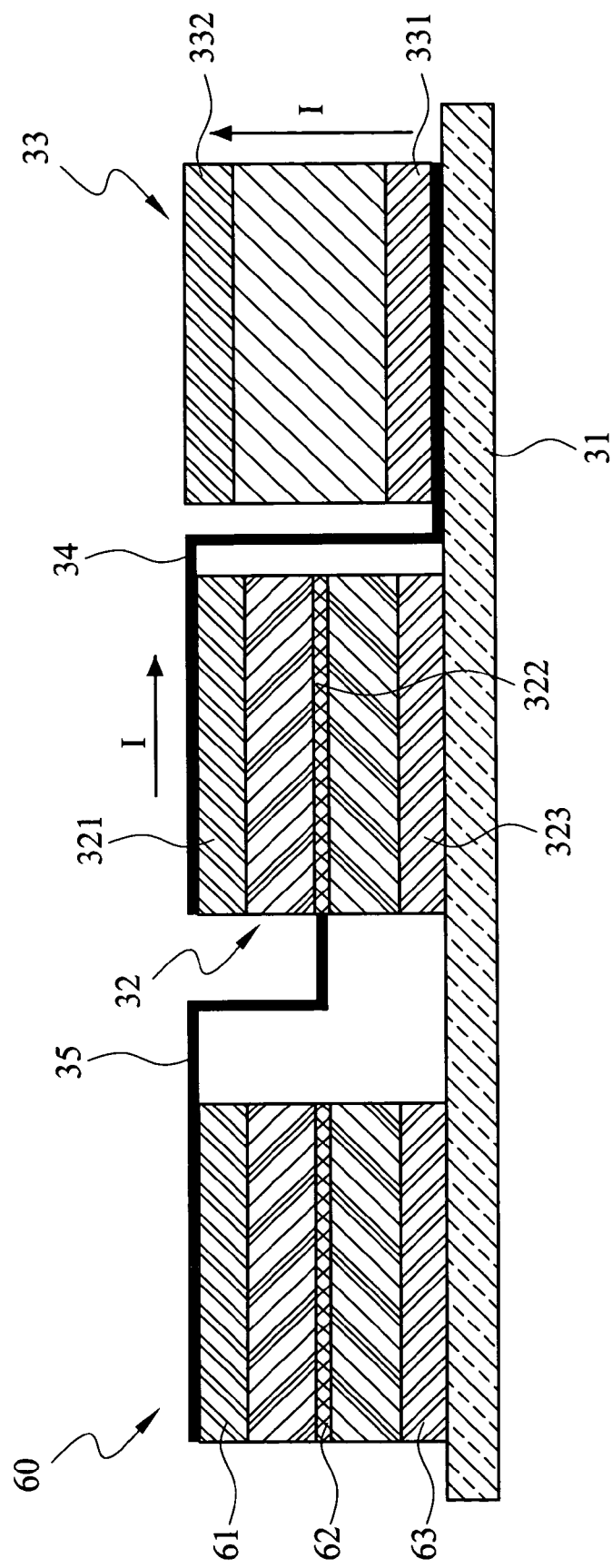
FIG. 15 is a sectional drawing showing a fifth aspect of the horizontal organic light emitting transistor assembly according to the present invention.

In FIG. 15, the fifth aspect of the horizontal organic light emitting transistor assembly 30 further comprises a fourth vertical transistor 60, which may be a hot-carrier transistor having a second collector 61, a second base 62 and a second emitter 63. Alternatively, the fourth vertical transistor 60 may be a space-charge-limited transistor having second collector 61, a second grid (not shown) and a second emitter 63.

The second collector 61 of the fourth vertical transistor 60 is electrically connected to the third vertical transistor 32 through a fourth conductor 35. The third vertical transistor 32 may be also a space-charge-limited transistor or a hot-carrier transistor. Thus, the fourth conductor 35 can electrically connect the first grid 322 of the space-charge-limited transistor or the first base of the hot-carrier transistor. By using the fourth vertical transistor 60 to modulate the current of the third vertical transistor 32, the light-emitting intensity of the third organic light emitting diode 33 can in turn get controlled.

<Application of Vertical Organic Light Emitting Transistor Assembly>

Figure 16A:
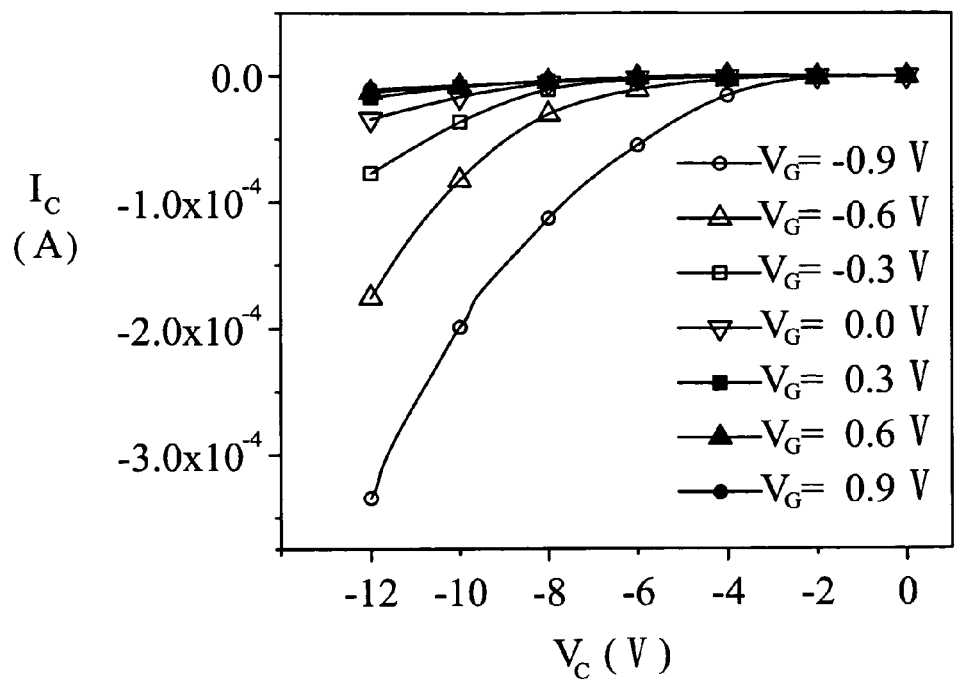
FIG. 16A is a diagram showing a relationship between a third electrode voltage and a third electrode current of the vertical organic light emitting transistor assembly of FIG. 3 at various second electrode voltages, wherein the second electrode has openings each being sized as 0.1 micron in diameter.
Figure 16B:
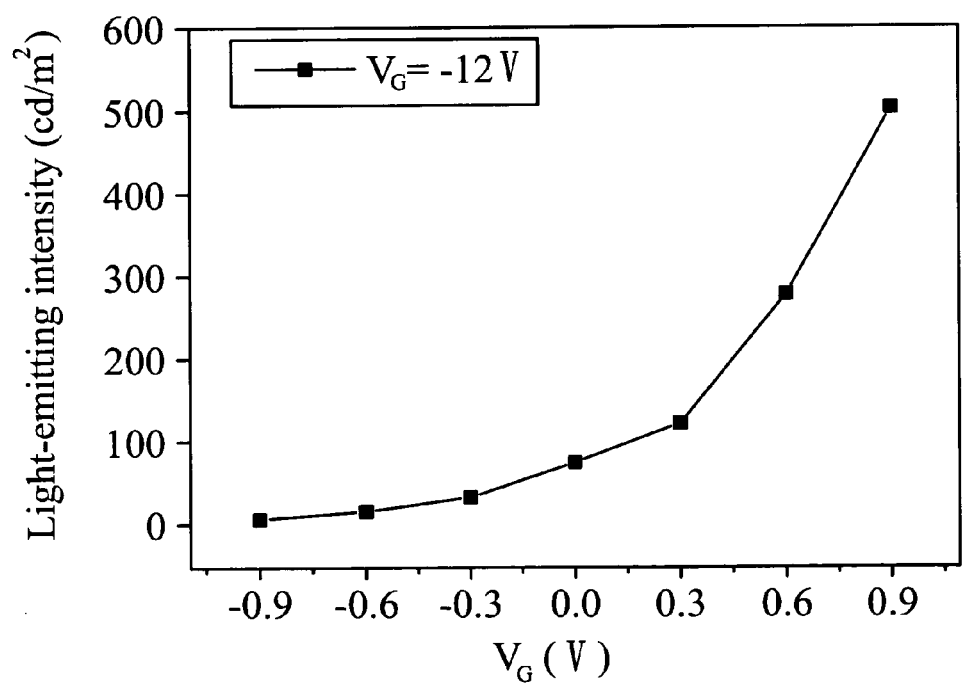
FIG. 16B is a diagram according to FIG. 16A showing a relationship between the second electrode voltage and an illumination when the third electrode voltage is −12V.
Figure 17A:
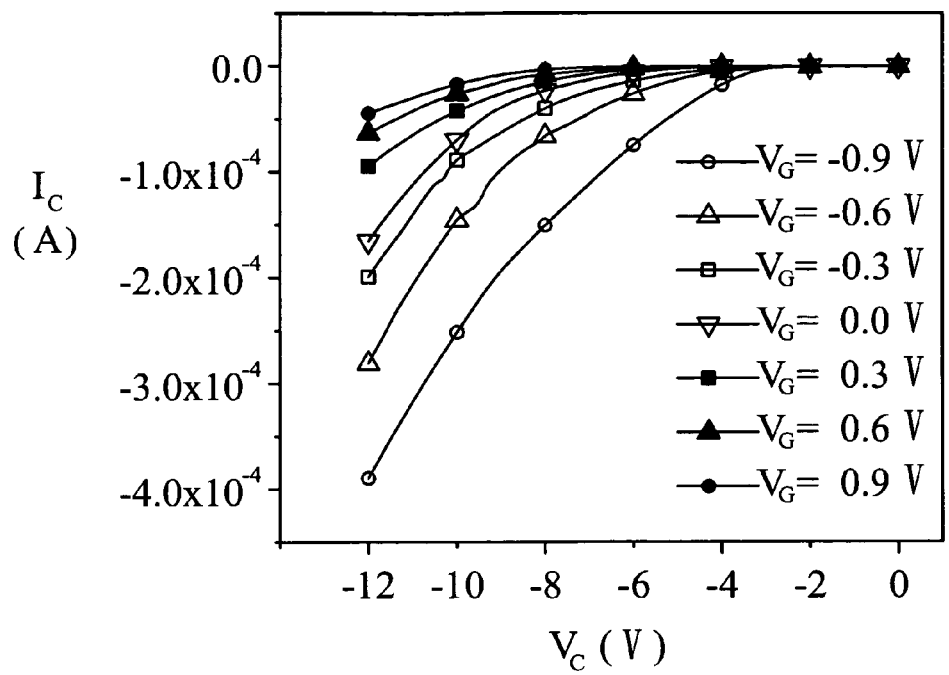
FIG. 17A is a diagram showing a relationship between the third electrode voltage and the third electrode current of the vertical organic light emitting transistor assembly of FIG. 3 at various second electrode voltages, wherein the second electrode has openings each being sized as 0.2 micron in diameter.
Figure 17B:
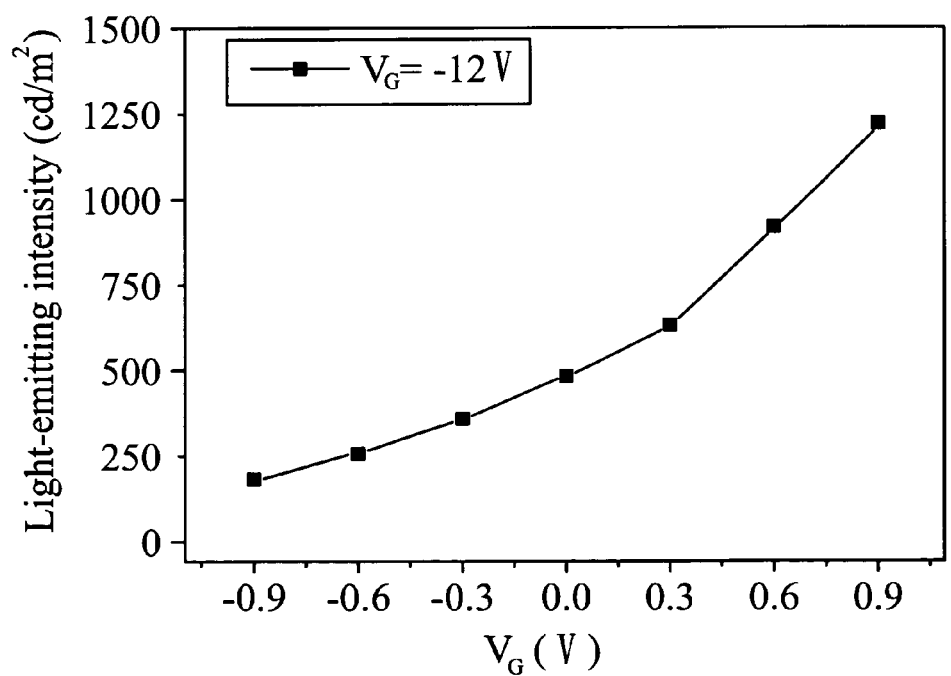
FIG. 17B is a diagram according to FIG. 17A showing a relationship between the second electrode voltage and the illumination when the third electrode voltage is −12V.

FIG. 16A is a diagram showing a relationship between a third electrode voltage $V_C$ and a third electrode current $I_C$ of the vertical organic light emitting transistor assembly 10 of FIG. 3 at various second electrode voltages $V_G$, wherein the second electrode 113 has openings each being sized as 0.1 micron in diameter. FIG. 16B is a diagram according to FIG. 16A showing a relationship between the second electrode voltage $V_G$ and an illumination when the third electrode voltage $V_C$ is −12V. FIG. 17A is a diagram showing the relationship between the third electrode voltage $V_C$ and the third electrode current $I_C$ of the vertical organic light emitting transistor assembly 10 of FIG. 3 at various second electrode voltages $V_G$, wherein the second electrode 113 has openings each being sized as 0.2 micron in diameter. FIG. 17B is a diagram according to FIG. 17A showing the relationship between the second electrode voltage $V_G$ and the illumination when the third electrode voltage $V_C$ is −12 CV.

For further explaining the efficiency of the vertical organic light emitting transistor assembly 10, the following description is directed to the third aspect of the vertical organic light emitting transistor assembly 10 as shown in FIG. 3.

Herein, the first electrode 111 may be made of ITO/PEDOT. The first organic layer 112 may be made of poly(3-hexylthiophene). The second organic layer 121 may be made of Superyellow manufactured by German Covion (now merged by American Merck). The third electrode 122 may be made of barium/silver. The fourth electrode 123 may be made of aluminum/molybdenum oxide/PEDOT. In addition, the third electrode 122 is thin enough to be pervious to light by having a barium part as thick as 10 nanometer and a silver part as thick as 15 nanometer. The fourth electrode 123 is opaque and has an aluminum part as thick as about 60 nanometer. Moreover, the transparent substrate 13 for carrying the first electrode 111 is a glass substrate.

As shown in 16A, the second electrode 113 has opening each being sized as 0.1 micron in diameter. When the first electrode voltage is 0V, the third electrode current $I_C$ can be modulated by varying the second electrode voltage $V_G$ and the third electrode voltage $V_C$. It can be demonstrated from FIG. 16A that when the second electrode voltage $V_G$ being modulated from −0.9V to 0.9V, and the third electrode voltage $V_C$ is −12V, the third electrode current $I_C$ presents relatively high absolute values while the same second electrode voltage $V_G$ is 0.9V.

Thus, we can fix the first electrode voltage at 0V and fix the third electrode voltage $V_C$ at −12V to further measure the light-emitting intensity of the vertical organic light emitting transistor assembly 10 at various second electrode voltages $V_G$. As can be seen in FIG. 16B, when the second electrode voltage $V_G$ is modulated to 0.9V from −0.9V, the light-emitting intensity of the vertical organic light emitting transistor assembly 10 correspondingly raises from 7.5 cd/m² to 501 cd/m².

Thus, the present invention can easily satisfy a normal application of LEDs to a display device where only about 150 cd/m² to 200 cd/m² of light-emitting intensity of the LED is required. Furthermore, by modulating the second electrode voltage $V_G$ and third electrode voltage $V_C$, a variable light-emitting intensity can be provided according to practical needs. Consequently, the vertical organic light emitting transistor assembly 10 is readily adaptive to a display device or any other electronic devices.

On the other hand, the second electrode 113 having a different opening size may be also implemented. For example, the second electrode 113 may have openings each being sized as 0.2 micron in diameter. FIG. 17A is a diagram showing the relationship between the third electrode voltage $V_C$ and the third electrode current $I_C$ of the vertical organic light emitting transistor of FIG. 3 at various second electrode voltages, wherein the second electrode 113 has openings each being sized as 0.2 micron.

Through FIG. 17A, with the same second electrode voltage $V_G$, the same third electrode voltage $V_C$ and the same third electrode current $I_C$, the relative large size of the openings of the second electrode 113 leads to a absolute value greater than that in FIG. 16A. Besides, as shown in FIG. 17B, the present vertical organic light emitting transistor assembly 10 provides a light-emitting intensity greater than that of the former vertical organic light emitting transistor assembly 10 of FIG. 16 B. As a conclusion, the opening size of the second electrode 113 can be implemented as a factor in modulating the light-emitting intensity of the vertical organic light emitting transistor assembly 10.

Although the particular embodiments of the invention have been described in detail for purposes of illustration, it will be understood by one of ordinary skill in the art that numerous variations will be possible to the disclosed embodiments without going outside the scope of the invention as disclosed in the claims.

What is claimed is:

1. A vertical organic light emitting transistor assembly, comprising:
   a first vertical transistor, having a first electrode, a first organic layer stacked on the first electrode, and a second electrode located in the first organic layer;
   a first organic light emitting diode, having a second organic layer perpendicularly stacked on the first vertical transistor, and a third electrode stacked on the second organic layer; and
   a hot-carrier transistor, which has an emitter, a base and a collector, wherein the collector is electrically connected to the second electrode through a first conductor.

2. The vertical organic light emitting transistor assembly as claimed in claim 1, wherein the first electrode is an anode and the second electrode is a grid while the third electrode is a cathode.

3. The vertical organic light emitting transistor assembly as claimed in claim 1, wherein the first electrode is a cathode and the second electrode is a grid while the third electrode is an anode.

4. The vertical organic light emitting transistor assembly as claimed in claim 1, further comprising a fourth electrode, which is arranged between the first organic layer and the second organic layer.

5. The vertical organic light emitting transistor assembly as claimed in claim 4, wherein the first electrode is an anode and the second electrode is a grid while the third electrode is a cathode and the fourth electrode is an anode.

6. The vertical organic light emitting transistor assembly as claimed in claim 4, wherein the first electrode is a cathode and the second electrode is a grid while the third electrode is an anode and the fourth electrode is a cathode.

7. The vertical organic light emitting transistor assembly as claimed in claim 1, wherein a transparent substrate is arranged beside the first vertical transistor.

8. The vertical organic light emitting transistor assembly as claimed in claim 1, wherein a glass substrate or a plastic substrate is arranged beside the first vertical transistor.

9. The vertical organic light emitting transistor assembly as claimed in claim 1, wherein a transparent substrate is arranged beside the first organic light emitting diode.

10. The vertical organic light emitting transistor assembly as claimed in claim 1, wherein a glass substrate or a plastic substrate is arranged beside the first organic light emitting diode.

11. The vertical organic light emitting transistor assembly as claimed in claim 1, wherein the second electrode has openings each being sized as 0.1~0.2 micron in diameter.

12. A vertical organic light emitting transistor assembly, comprising:
   a second vertical transistor, having a fifth electrode, a third organic layer stacked on the fifth electrode, an insulation layer stacked on the third organic layer, and a sixth electrode stacked on the insulation layer;

a second organic light emitting diode, having a fourth organic layer perpendicularly stacked on the second vertical transistor, and a seventh electrode stacked on the fourth organic layer; and a space-charge-limited transistor, which has an emitter, a grid and a collector, wherein the collector is electrically connected to the sixth electrode through a second conductor.

13. The vertical organic light emitting transistor assembly as claimed in claim 12, wherein the fifth electrode is an anode and the sixth electrode is a base while the seventh electrode is a cathode.

14. The vertical organic light emitting transistor assembly as claimed in claim 12, wherein the fifth electrode is a cathode and the sixth electrode is a base while the seventh electrode is an anode.

15. The vertical organic light emitting transistor assembly as claimed in claim 12, wherein the second vertical transistor further comprises a fifth organic layer, which is arranged between the sixth electrode and the fourth organic layer.

16. The vertical organic light emitting transistor assembly as claimed in claim 12, wherein the second vertical transistor further comprises a fifth organic layer and an eighth electrode, in which the fifth organic layer is arranged between the sixth electrode and the eighth electrode while the eighth electrode is arranged between the fifth organic layer and the fourth organic layer.

17. The vertical organic light emitting transistor assembly as claimed in claim 16, wherein the fifth electrode is an anode, and the sixth electrode is a base while the seventh electrode is a cathode and the eighth electrode is an anode.

18. The vertical organic light emitting transistor assembly as claimed in claim 16, wherein the fifth electrode is a cathode, and the sixth electrode is a base while the seventh electrode is an anode and the eighth electrode is a cathode.

19. The vertical organic light emitting transistor assembly as claimed in claim 12, wherein a transparent substrate is arranged beside the second vertical transistor.

20. The vertical organic light emitting transistor assembly as claimed in claim 12, wherein a glass substrate or a plastic substrate is arranged beside the second vertical transistor.

21. The vertical organic light emitting transistor assembly as claimed in claim 12, wherein a transparent substrate is arranged beside the second organic light emitting diode.

22. The vertical organic light emitting transistor assembly as claimed in claim 12, wherein a glass substrate or a plastic substrate is arranged beside the second organic light emitting diode.

\* \* \* \* \*